United States Patent
Yajima et al.

(10) Patent No.: US 7,967,912 B2
(45) Date of Patent: Jun. 28, 2011

(54) MANUFACTURING APPARATUS FOR SEMICONDUCTOR DEVICE AND MANUFACTURING METHOD FOR SEMICONDUCTOR DEVICE

(75) Inventors: Masayoshi Yajima, Kanagawa-ken (JP); Kunihiko Suzuki, Shizuoka-ken (JP)

(73) Assignee: NuFlare Technology, Inc., Numazu-shi (JP)

( * ) Notice: Subject to any disclaimer, the term of this patent is extended or adjusted under 35 U.S.C. 154(b) by 240 days.

(21) Appl. No.: 12/324,578

(22) Filed: Nov. 26, 2008

(65) Prior Publication Data
US 2009/0142933 A1    Jun. 4, 2009

(30) Foreign Application Priority Data

Nov. 29, 2007    (JP) .................................. 2007-308852
Mar. 24, 2008    (JP) .................................. 2008-075957

(51) Int. Cl.
| C23C 16/455 | (2006.01) |
| C23C 16/458 | (2006.01) |
| C23C 16/54  | (2006.01) |

(52) U.S. Cl. ........................................ 118/730; 118/725
(58) Field of Classification Search .................. 118/730, 118/725
See application file for complete search history.

(56) References Cited

U.S. PATENT DOCUMENTS

| 5,173,336 | A   | * | 12/1992 | Kennedy ..................... 427/248.1 |
| 5,520,742 | A   | * | 5/1996  | Ohkase ........................ 118/724 |
| 5,972,116 | A   | * | 10/1999 | Takagi .......................... 118/719 |
| 6,059,885 | A   | * | 5/2000  | Ohashi et al. ................. 118/730 |
| 6,113,705 | A   | * | 9/2000  | Ohashi et al. ................. 118/730 |
| 6,752,872 | B2  | * | 6/2004  | Inada et al. ................... 118/300 |
| 6,869,641 | B2  | * | 3/2005  | Schmitt ..................... 427/248.1 |
| 7,452,827 | B2  | * | 11/2008 | Gianoulakis et al. .......... 438/778 |
| 7,691,203 | B2  | * | 4/2010  | Inagaki et al. ................. 118/715 |
| 2004/0052972 | A1 | * | 3/2004 | Schmitt ........................ 427/569 |
| 2006/0234514 | A1 | * | 10/2006 | Gianoulakis et al. ......... 438/758 |
| 2009/0142933 | A1 | * | 6/2009 | Yajima et al. ................. 438/758 |
| 2009/0272323 | A1 | * | 11/2009 | Ito .................................. 118/725 |

FOREIGN PATENT DOCUMENTS

| JP | 62-2525  | * | 1/1987 |
| JP | 11-67675 |   | 3/1999 |

* cited by examiner

*Primary Examiner* — Mary Wilczewski
(74) *Attorney, Agent, or Firm* — Finnegan, Henderson, Farabow, Garrett & Dunner, L.L.P.

(57) ABSTRACT

A manufacturing apparatus for a semiconductor device, includes: a reaction chamber to which a wafer w is loaded; a gas supply port for supplying first process gas including source gas from an upper portion of the reaction chamber; a first rectifying plate for supplying the first process gas onto the wafer in a rectifying state; a first gas exhaust port for exhausting gas from a lower portion of the reaction chamber; a second gas exhaust port for exhausting gas from the upper portion of the reaction chamber; a heater for heating the wafer w; a susceptor for retaining the wafer w; and a rotation drive unit for rotating the wafer w.

6 Claims, 3 Drawing Sheets

MANUFACTURING APPARATUS FOR SEMICONDUCTOR DEVICE AND MANUFACTURING METHOD FOR SEMICONDUCTOR DEVICE

CROSS-REFERENCE TO RELATED APPLICATIONS

This application is based upon and claims the benefit of priority from the prior Japanese Patent Applications No. No. 2007-308852 filed on Nov. 29, 2007, No. 2008-075957 filed on Mar. 24, 2008, the entire contents of which are introduced herein by reference.

BACKGROUND OF THE INVENTION

1. Field of the Invention

The present invention relates to a manufacturing apparatus for a semiconductor device and a manufacturing method for a semiconductor device, which are used for a film formation on a semiconductor wafer by supplying process gas while heating the wafer.

2. Description of the Related Art

In recent years, with demands of further price reduction and high performance of a semiconductor device, there has been required high productivity in a film formation process as well as high quality of the semiconductor device such as improvement in uniformity of a film thickness.

To satisfy such requirements, there has been used an approach to heating a wafer while rotating the wafer at high-speed such as 900 rpm and more, using an Single-wafer-processing type epitaxial film formation apparatus, as disclosed in Japanese Patent Application Laid-Open No. 11-67675. Further, it has been expected that high productivity and improvement in uniformity of a film thickness can be achieved by using inexpensive Cl based source gas such as trichlorosilane (hereinafter referred to as "TCS") and dichlorosilane in addition to using a wafer having a large diameter, for example, $\phi$300 mm.

However, there is a problem that high productivity is difficult to achieve, when an epitaxial film having a large thickness, for example, more than 150 μm used for IGBT (insulated gate bipolar transistor) is formed.

Furthermore, by supplying the source gas described above onto a wafer, an epitaxial film is formed, and a gas flow to an outer periphery is generated. Such a gas flow reaches a member, for example, a wall surface of a reaction chamber so that a deposited material which is a cause for particles tends to be generated, and upward and downward gas flows are generated.

The upward gas flow stays on the way to an upper wall of the reaction chamber and has an influence upon the film formation capability of a wafer peripheral portion. In addition, the downward gas flow stays before gas exhaust so that the gas flow intrudes into a heater unit and a rotation drive unit for rotating the heater unit and causes clogging due to the resulting deposited material, thus degrading productivity.

Accordingly, a diameter of the reaction chamber may be increased, however, a large apparatus will be required. In addition, purge gas may be introduced into the heater unit or the rotation drive unit, however, a large amount of purge gas will be required, thus causing a problem of high running cost.

SUMMARY OF THE INVENTION

As described above, for example, in a thick film formation process for a semiconductor device, there are some problems, such as difficulty in achieving high productivity, degradation of film thickness uniformity due to a gas flow in a reaction chamber and generation of deposited material.

It is therefore an object of the present invention to provide a manufacturing apparatus for a semiconductor device and a manufacturing method for a semiconductor device, capable of achieving high productivity and performing uniform film formation on a wafer by controlling a gas flow in a reaction chamber for suppression of gas residence.

According to an aspect of the present invention, there is provided a manufacturing apparatus for a semiconductor device, including: a reaction chamber to which the wafer is loaded; a gas supply unit for supplying first process gas including source gas from an upper portion of the reaction chamber; a first rectifying plate for supplying the first process gas onto the wafer in a rectifying state; a first gas exhaust unit for exhausting gas from a lower portion of the reaction chamber; a second gas exhaust unit for exhausting gas from an upper portion of the reaction chamber; a heater for heating the wafer; a susceptor for retaining the wafer; and a rotation drive unit for rotating the wafer.

According to an aspect of the present invention, there is provided a manufacturing method for a semiconductor device, including: retaining a wafer in a reaction chamber; supplying a first process gas including source gas onto a surface of the wafer in a rectifying state; exhausting gas from upper and lower portions of the reaction chamber and adjusting the pressure in the reaction chamber to be predetermined pressure; and heating the wafer while being rotated and forming a film on a surface of the wafer.

According to an aspect of the present invention, there is provided a manufacturing apparatus for a semiconductor device, including: a reaction chamber to which a wafer is loaded; a gas supply unit for supplying first process gas including source gas from an upper portion of the reaction chamber; a rectifying plate for supplying the first process gas onto the wafer in a rectifying state; a first gas exhaust unit for exhausting gas from a lower portion of the reaction chamber; a second gas exhaust unit for exhausting gas from an upper portion of the reaction chamber; a heater unit including a heater for heating the wafer and a susceptor for retaining the wafer; a rotation drive unit connected to the heater unit and rotating the wafer; and fins disposed between the heater unit and the bottom face of the reaction chamber and generating a gas flow in a direction form direction from a rotating shaft to an outer periphery.

According to an aspect of the present invention, there is provided a manufacturing method for a semiconductor device, including: retaining a wafer on a heater unit in a reaction chamber; supplying process gas including source gas onto a surface of the wafer in a rectifying state; heating the wafer while being rotated by a rotation drive unit; forming a gas flow in a direction from a rotating shaft of the rotation to an outer periphery on the bottom face of the reaction chamber; and exhausting gas from upper and lower portions of the reaction chamber and adjusting the pressure in the reaction chamber to be predetermined pressure.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which is introduced in and constitute a part of this specification, illustrates an embodiment of the invention and together with the description, serves to explain the principles of the invention.

DETAILED DESCRIPTION

Reference will now be made in detail to the present embodiment of the invention, an example of which is shown in the accompanying drawings.

First Embodiment

Figure 1:
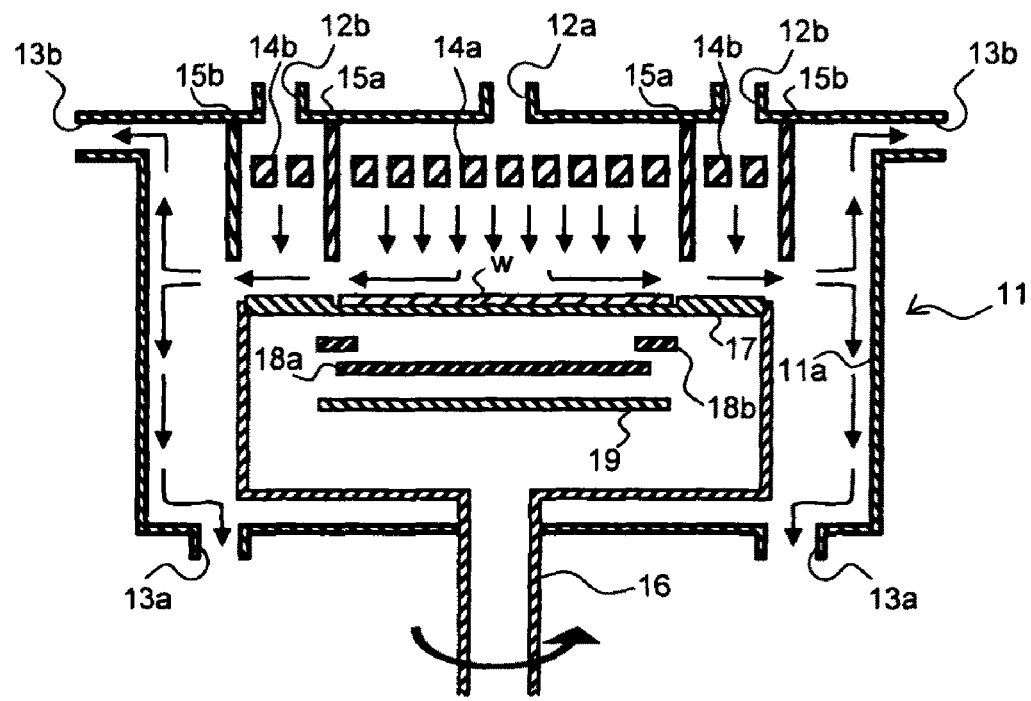
FIG. 1 is a sectional view of a manufacturing apparatus for a semiconductor device according to an embodiment of the present invention.

FIG. 1 is a sectional view of a manufacturing apparatus for a semiconductor device according to the present embodiment. In a reaction chamber 11 in which film formation for a wafer w is performed, gas supply ports 12a and 12b are provided. The gas supply ports 12a and 12b are connected to a gas supply unit (not shown) for supplying process gas including source gas, such as TCS and dichlorosilane, onto the wafer w from an upper portion of the reaction chamber 11 and a gas supply port 12b connected with a gas supply unit (not shown) for supplying dilution gas, film formation reaction suppression gas or cleaning gas onto the outer periphery of the wafer, respectively.

On upper portions of side walls and a bottom wall of the reaction chamber 11, plural, for example, two gas exhaust ports 13a and plural, for example, two gas exhaust ports 13b are provided, respectively. The gas exhaust ports 13a, 13b are connected with a gas exhaust unit for exhausting gas and controlling the pressure in the reaction chamber 11 to be constant (atmospheric-pressure).

Figure 2:
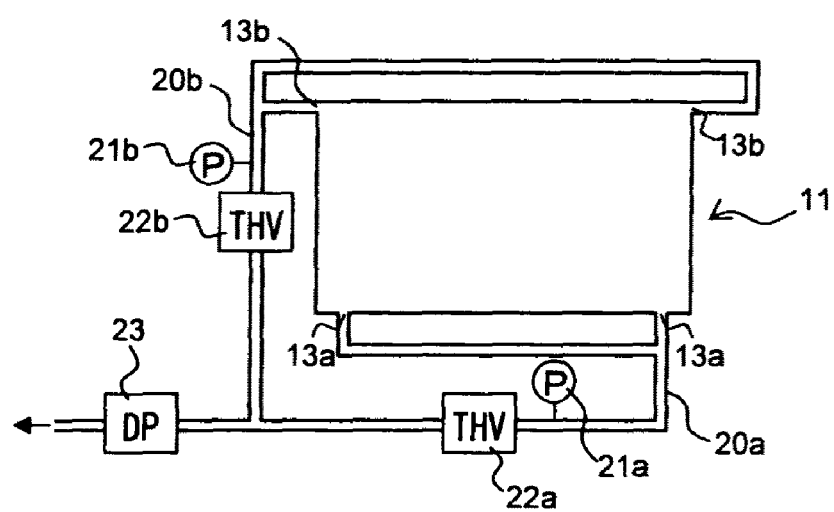
FIG. 2 is a conceptual view of an exhaust system according to an embodiment of the present invention.

FIG. 2 is a conceptual view of an exhaust system having a gas exhaust unit. Two exhaust pipes from the two gas exhaust ports 13a are collected and connected to an exhaust pipe 20a outside the reaction chamber 11. An Similar configuration is provided for two gas exhaust ports 13b and an exhaust pipe 20b. The respective exhaust pipes 20a, 20b are installed with pressure gauges 21a, 21b and pressure control valves 22a, 22b. The exhaust pipe 20a, 20b are further collected and connected to a diffusion pump On the upper portion of the reaction chamber 11, there are provided rectifying plate 14a for supplying process gas supplied from the gas supply port 12a onto the wafer w in a rectifying state and outside of the rectifying plate 14a, rectifying plate 14b for supplying dilution gas or the like supplied from the gas supply port 12b onto the outer periphery of the wafer w in a rectifying state.

Between the rectifying plates 14a, 14b, that is, at the outer periphery of the rectifying plate 14a, a partition plate 15a is disposed and, at the outer periphery of the rectifying plate 14b, a partition plate 15b is disposed. Upper ends of the partition plates 15a, 15b are connected to the top of the reaction chamber 11, and lower ends of the partition plates 15a, 15b are disposed so as to be at a height of, for example, 20 mm from a surface of the wafer W.

On lower portion of the reaction chamber 11, there are provided with a rotation drive unit 16 for rotating the wafer w and a susceptor 17 for retaining the wafer w. The rotation drive unit 16 includes a motor (not shown) and a rotating shaft (not shown), and the susceptor 17 is connected to the reaction drive unit.

Below the susceptor 17, an in-heater 18a for heating the wafer w is installed. Between the susceptor 17 and the in-heater 18a, an out-heater 18b for heating a peripheral edge portion of the wafer w is disposed. Below the in-heater 18a, a disc-shaped reflector 19 for effectively heating the wafer w is disposed.

Using such a manufacturing apparatus for a semiconductor device, for example, an Si epitaxial film is formed on the wafer w. First, a wafer w of, for example, φ200 mm is loaded into the reaction chamber 11 and placed on the susceptor 17. Temperatures of the in-heater 18a and the out-heater 18b are controlled so that a temperature of the wafer w is 1,100° C., and the wafer w is rotated, for example, at 900 rpm, by the rotation drive unit 16.

Further, the process gas conditioned to a TCS concentration of, for example, 2.5% is introduced for example, at 50 SLM from the gas supply port 12a, and is supplied onto the wafer w in a rectifying state through the rectifying plate 14a. Hence, an Si epitaxial film is grown on the wafer.

At this time, $H_2$ is concurrently introduced, for example, at 50 SLM as dilution gas from the gas supply port 12b and supplied onto the outer periphery of the wafer w in a rectifying state through the rectifying plate 14b to dilute the process gas including TCS on the outer periphery of the wafer w. The supplied dilution gas is suppressed from flowing onto the wafer w and from being mixed with the process gas by controlling supply rate and concentration of the gas, or the partition plate 15.

At this time, the process gas supplied onto the wafer w and including excessive TCS, dilution gas and gas including HCl which is a reaction by-product (hereinafter referred to as "exhaust gas"), through a path shown by arrows in FIG. 1, reach a wall surface 11a of the reaction chamber, and separately flow upward and downward along the wall surface 11a of the reaction chamber. The exhaust gas reaches the gas exhaust ports 13a, 13b without residence. Further, the exhaust gas is exhausted by the diffusion pump 23 through the gas exhaust ports 13a, 13b and the exhaust pipes 20a, 20b connected thereto, respectively.

At this time, the pressure gauges 21a, 21b mounted on the gas exhaust ports 13a, 13b, respectively, detect pressures. Based on the detected pressures, the opening degrees of the pressure control valves 22a, 22b are adjusted. Hence, the pressure in the reaction chamber 11 is controlled to be constant (atmospheric pressure).

As described above, the process gas including C1 based source gas such as TCS is supplied onto the wafer w in a rectifying state and the exhaust gas is exhausted immediately from the gas exhaust ports 13*a*, 13*b* without residence in the reaction chamber 11, thus improving an epitaxial growth rate without a large apparatus.

In epitaxial growth using Cl based source gas, the epitaxial growth rate falls with time passage. For example, in the case of TCS usage, when TCS and H$_2$ are supplied, a reaction of Equation (1) below proceeds to the right so that an Si epitaxial film is formed, but HCl is also generated.

$$SiHCl_3 + H_2 \rightarrow Si + 3HCl \qquad (1)$$

In the absence of the upper gas exhaust port 13*b*, HCl flowing upward convects and flows onto the wafer surface again. The reaction shown in (1) is an equilibrium reaction including a plurality of reactions and therefore when HCl mole ratio on a wafer W becomes high, an equilibrium shifts to the left. Accordingly, it may be thought that an advance of Si formation reaction is suppressed and the epitaxial growth rate is lowered.

Accordingly, it may be thought that HCl which has flowed upward is exhausted directly, TCS is supplied with residence suppressed and the equilibrium reaction of Equation (1) proceeds to the right side.

Further, the process gas including source gas is supplied onto a wafer w and, H$_2$ as dilution gas is also supplied on the outer periphery of the wafer w. Hence, in parallel to film formation process, deposition of polysilicon and a like on the outer periphery of the wafer w can be suppressed.

At this time, H$_2$ is used as gas supplied onto the outer periphery of the wafer w. However, the dilution gas is not limited to H$_2$. Inert gas such as He, Ar having no effect on a film formation can be available. In that case, use of heavy gas such as Ar allows the process gas on the outer periphery of the wafer w to be diluted and removed.

Further, dilution gas is not limited to H$_2$, Ar or the like. It is also effective to include film formation reaction suppression gas such as HCl which can shift an equilibrium of a film formation reaction to film formation suppression side. In addition, proper supply of cleaning gas including HCl with adjusted concentration allows deposited material such as polysilicon on the outer periphery of the wafer w to be removed.

As described above, by suppressing and removing deposited material on the outer periphery of the wafer w in parallel to the film formation process, an influence upon wafer quality by generation of particles and sticking of the wafer w can be suppressed. Further, since deterioration of a member by the deposited material is suppressed, the frequency of cleaning can be reduced and degradation of productivity can be suppressed.

In the present embodiment, the rectifying plates 14*a*, 14*b* are provided to supply different types of gases. Rectification of gas using the rectifying plates 14*a*, 14*b* allows gas to be uniformly supplied onto the wafer w.

Hence, the uniformity of film thickness of an epitaxial film formed on the wafer w can be obtained. Further, by supplying of rectified gas on the outer periphery of the wafer w, source gas on the outer periphery of the wafer w can be effectively removed.

Between the rectifying plates 14*a* and 14*b*, the partition plate 15*a* is disposed so that the distance from the lower end of the partition plate 15*a* to the wafer w surface is 20 mm. Although a mixing state of the process gas supplied onto the wafer w with the gas supplied onto the outer periphery of the wafer w is mainly controlled by the flow rate and concentration of the gas supplied onto the outer periphery of the wafer w, the partition plate 15*a* can effectively suppress mixing of the gas.

From the viewpoint of gas mixing suppression, the partition plate 15*a* is preferably provided as adjacent to the wafer w as possible. However, the gas supplied onto the rotating wafer w forms a boundary layer onto the wafer w and excessive gas is exhausted in an outer periphery direction. Accordingly, the partition plate is required to be provided so as not to be a block in a gas exhaust path. For example, it is sufficient that, a deposit volume on the partition plate 15 when an installation height of the partition plate 15*a* is changed under desired process conditions is measured and the partition plate 15*a* is installed at such a height that generation amount of the deposited material can be reduced.

The partition plate 15*b* is provided on the outer periphery of the rectifying plate 14*b* so as to be the same height as the partition plate 15*a*. The installation of the partition plate 15*b* can more effectively suppress mixing of the gas exhausted with the gas supplied onto the outer periphery of the wafer w, in the same way as provision of the partition plate 15*a*.

Second Embodiment

Figure 3:
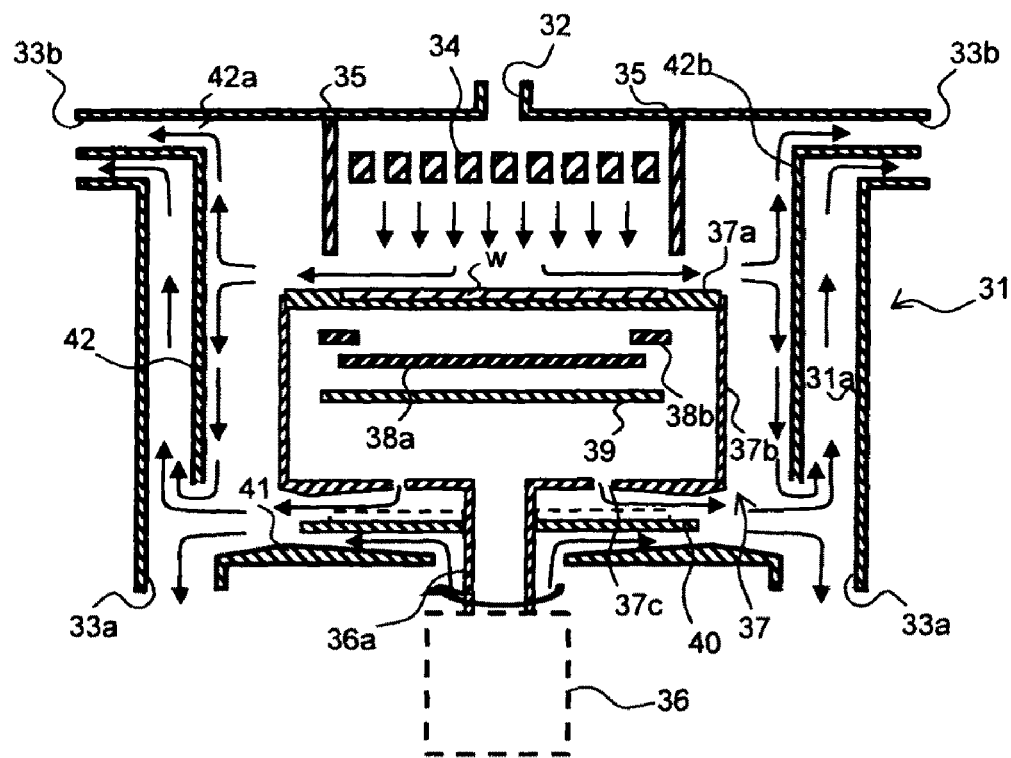
FIG. 3 is a sectional view of a manufacturing apparatus for a semiconductor device according to another embodiment of the present invention.

FIG. 3 is a sectional view of a manufacturing apparatus for a semiconductor device according to the present embodiment. In a reaction chamber 31 in which film formation for a wafer w is performed, a gas supply port 32 is provided. The gas supply port 32 is connected to a gas supply unit (not shown) for supplying process gas including source gas, such as TCS and dichlorosilane onto the wafer w from an upper portion of the reaction chamber 31. A bottom of the reaction chamber 31, plural, for example, two gas exhaust ports 33*a* are provided, and on upper portion of side wall of the reaction chamber 31, plural, for example, two gas exhaust ports 33*b* are provided, respectively in the same as for First Embodiment. The gas exhaust ports 33*a*, 33*b* are are provided for exhausting gas and controlling the pressure in the reaction chamber 31 to be constant (atmospheric-pressure).

On the upper portion of the reaction chamber 31, there is provided rectifying plate 34 for supplying process gas supplied from the gas supply port 32 onto the wafer w in a rectifying state. On the outer periphery of the rectifying plate 34, partition plate 35 is provided. The upper end of the partition plate 35 is connected to an upper portion of the reaction chamber 31 and the lower end of the partition plate 35 is installed so as to be 20 mm from the surface of the wafer w.

On the lower portion of the reaction chamber 31, there are provided a rotation drive unit 36. The rotation drive unit 36 includes a motor (not shown) and a rotating shaft 36*a*. On the upper portion of the rotation drive unit 36, there is installed a heater unit 37 connected to the rotation drive unit 36 for rotating the wafer w.

The heater unit 37 has a susceptor 37*a* for retaining the wafer w and a ring 37*b* for supporting the susceptor 37*a*. Inside the heater unit 37, that is, in a space surrounded by the susceptor 37*a* and the ring 37*b*, an in-heater 38*a* for heating the wafer w is installed. Between the susceptor 37*a* and the in-heater 38, an out-heater 38*b* for heating a peripheral edge of the wafer w is disposed. Below the in-heater 38*a*, a disc-shaped reflector 39 for efficiently heating the wafer w is installed.

At the lower portion of the heater unit 37, openings 37*c* are provided. The openings 37*c* are provided to prevent the wafer w from being dropped off due to a pressure difference by making a pressure in the heater unit 37 substantially equal to that in the reaction chamber 31.

Figure 4:
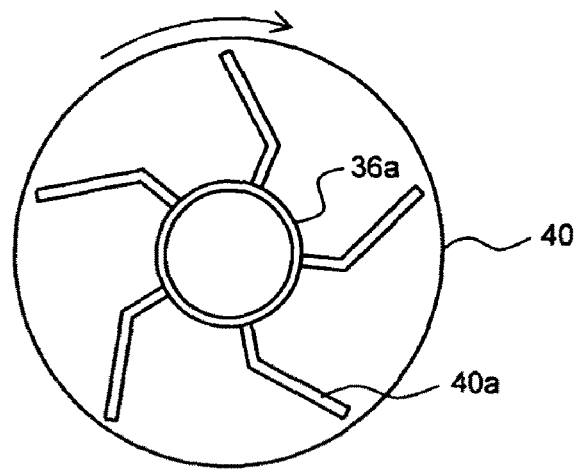
FIG. 4 is a top view illustrating a structure of a rotating plate according to another embodiment of the present invention.

Further, between the heater unit 37 and the bottom of the reaction chamber 31, there is provided a rotation plate 40. The rotation plate 40 is attached onto the rotating shaft 36*a* and generates a gas flow in the direction from the rotating shaft 36 to the outer periphery by rotating the rotating shaft 36a. FIG. 4 is a top view of the rotating plate. A plurality of (five herein) dog-legged fins 40a are provided on the top of the rotation plate 40.

On the lower face of the heater unit 37 and the bottom face of the reaction chamber 31, there are provided protruding portions 41 which narrow a gas passage in the direction from the rotating shaft to the outer periphery. Further, inside the reaction chamber 31, a liner 42 is provided to separate a downward gas flow from the wafer w surface from an upward gas flow generated by the rotation plate 40. At the upper portion of the liner 42, there are provided openings 42a connected to the gas exhaust port 33b to exhaust an upward gas flow from the surface of the wafer w. An exhaust system is constructed in the same way as for First Embodiment.

Using such a manufacturing apparatus for semiconductor device, for example, an Si epitaxial film is formed on the wafer w. First, in the same as for First Embodiment, a wafer w of, for example, φ200 mm is loaded into the reaction chamber 31 and placed on the susceptor 37a. Temperatures of the in-heater 38a and the out-heater 38b are controlled so that a temperature of the wafer w is 1,100° C., and the wafer w is rotated at, for example, 900 rpm by the rotation drive unit 36.

The process gas conditioned, for example, so that TCS concentration is 2.5% is introduced at, for example, 50 SLM through the gas supply port 12a and is supplied onto the wafer w in a rectifying state through the rectifying plate 14a to grow an Si epitaxial film on the wafer.

At this time, the process gas supplied onto the wafer w and including excessive TCS and the gas (exhaust gas) including HCl which is a reaction by-product reach a wall surface 42b of a liner 42 through a path shown by arrows in FIG. 3, and separately flow upward and downward along the wall surface 42a of the liner 42. The upward gas flow is exhausted from a gas exhaust ports 33b through openings 42a formed at the upper portion of the liner 42 in the same way as for First Embodiment.

At this time, the inside of the heater unit 37 is heated by the in-heater 38a and the out-heater 38b, however, the pressure in the heater unit 37 can be kept substantially equal to that in the reaction chamber 31.

According to the pressure in the heater unit 37, a gas flow from the opening 37c toward the lower portion of the heater unit 37 is generated. Further, the rotation plate 40 rotates with the rotation of the wafer w, and a gas flow in the direction from the rotating shaft 36a to an outer periphery is generated by the fins 40a.

The gas flow toward the outer periphery direction passes through a clearance below the liner 42 with the downward gas flow from the wafer w, and separately flows upward and downward along the wall surface 31a of the reaction chamber 31. The gas flow is exhausted from the gas exhaust ports 33a, 33b without residence in the same way as for First Embodiment.

At this time, exhaust pressures of the gas exhaust ports 33a, 33b are detected in the same way as First Embodiment. Opening degrees of respective pressure control valves are adjusted based on detected pressures. The pressure in the reaction chamber 31 is controlled so as to be constant (atmospheric-pressure) in this way.

As described above, the process gas including Cl based source gas such as TCS is supplied into the wafer w in a rectifying state, and the exhaust gas is exhausted from the exhaust ports 33a, 33b immediately without residence in the reaction chamber 31, thus improving epitaxial growth rate without a large apparatus.

Further, a gas flow in the direction from the rotating shaft 36a to the outer periphery is generated by the rotation plate 40 and is exhausted from the gas exhaust ports 33a, 33b immediately without residence in the reaction chamber 31. Accordingly, even if the openings 37c for preventing the wafer from dropping off due to a pressure difference is provided at the heater unit 37, it is possible to suppress intrusion of the gas flow including the process gas into the heater unit 37 or the rotation drive unit 36 for rotating the heater unit. In addition, by installation of the protruding portion 41, intrusion of the gas flow including the process gas from the outer periphery direction can be effectively suppressed.

Such suppression of intrusion of the gas flow including process gas enables to suppress generation of deposited material in the heater unit 37 or the rotation drive unit 36 and clogging due to the deposited material. Accordingly, the frequency of cleaning can be reduced and degradation of productivity can be prevented.

In the present embodiment, the rectifying plate may be divided in the same way as for First Embodiment, different gases may be flowed. Such a structure enables to obtain the same advantage as First Embodiment.

Figure 5:
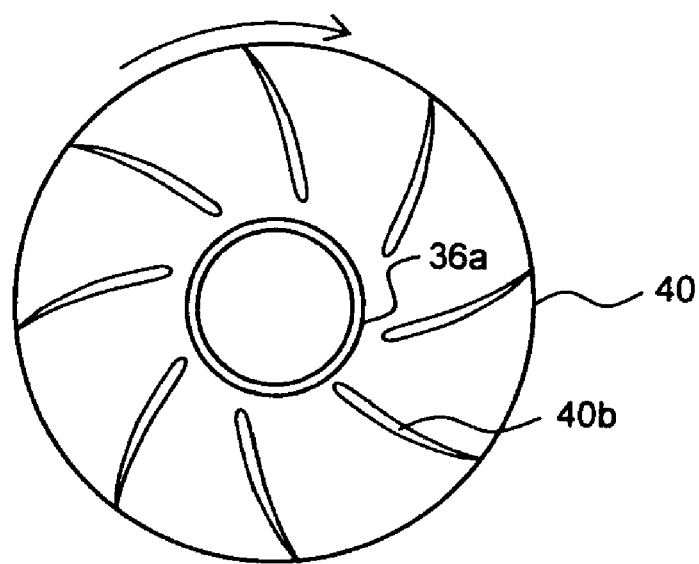
FIG. 5 is a top view illustrating a structure of a rotating plate according to another embodiment of the present invention.
Figure 6:
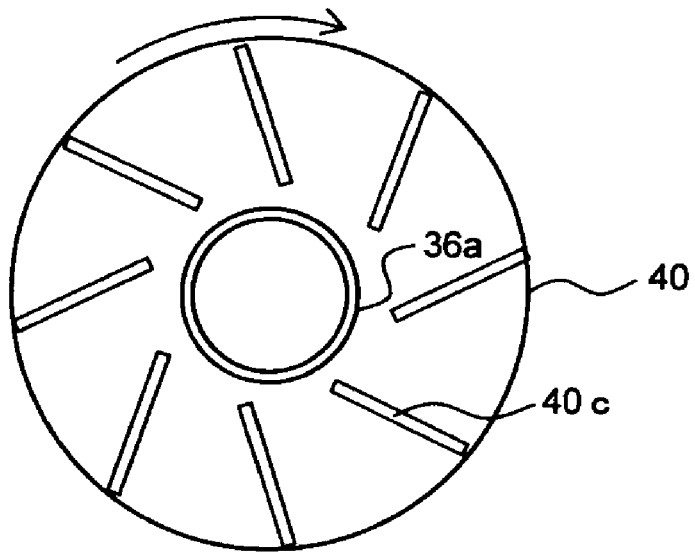
FIG. 6 is a top view illustrating a structure of a rotating plate according to another embodiment of the present invention.

In the present embodiment, the shape of the fins 40a of the rotation plate 40 was such a shape as shown in FIG. 4, which is not limited thereto. For example, as shown in FIG. 5, the fins 40b may have a shape having a curved surface by being spaced from the rotating shaft 36a. In addition, as shown in FIG. 6, the fins 40c may have a plate-like (linear) shape.

According to the present embodiment, a film such as an epitaxial film can be formed on a semiconductor wafer with high productivity. In addition, the yields of wafers and semiconductor devices manufactured through an element formation process and an element separation process can be improved and stable element characteristics of the semiconductor devices can be obtained. In particular, by applying to an epitaxial formation process of power semiconductor devices such as power MOSFET and IGBT, which require growth of a thick film having a thickness of 100 (m or more in an N-type base region, P-type base region or an insulation isolation region, satisfactory element characteristics can be obtained.

In the embodiment, a case in which an Si single-crystal layer (epitaxial film) is formed is described, the present embodiment may be applied to a case of polysilicon layer formation. In addition, the present embodiment is also applicable to formation of films except Si films such as SiO2 film and Si3N4 film and manufacture of compound semiconductors such as GaAs layer, GaAlAs and InGaAs, when film growth rate lowers with time.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing apparatus for a semiconductor device, performing film formation for a wafer, comprising:
   a reaction chamber to load a wafer;
   a gas supply unit for supplying first process gas including source gas from an upper portion of the reaction chamber;
   a rectifying plate for supplying the first process gas onto the wafer in a rectifying state;
   a first gas exhaust unit for exhausting gas from a lower portion of the reaction chamber;

a second gas exhaust unit for exhausting gas from an upper portion of the reaction chamber;

a heater unit including a heater for heating the wafer and a susceptor for retaining the wafer;

a rotation drive unit for rotating the wafer, the rotation drive unit connected to the heater unit; and a fin for generating a gas flow from a rotating shaft to an outer periphery, the fin disposed between the heater unit and the bottom face of the reaction chamber.

2. The manufacturing apparatus for a semiconductor device according to claim 1, further comprising a liner having an opening connected to the second gas exhaust unit at an outer periphery of the heater unit and above a horizontal position of the fin.

3. The manufacturing apparatus for a semiconductor device according to claim 1, further comprising a partition plate disposed at an outer periphery of the rectifying plate, wherein the lower end of the partition plate is positioned to be spaced from the upper surface of the wafer by a predetermined distance.

4. The manufacturing apparatus for a semiconductor device according to claim 1, wherein a clearance between the heater unit and the bottom face of the reaction chamber includes a narrower portion in a direction from the rotating shaft to the outer periphery.

5. The manufacturing apparatus for a semiconductor device according to claim 1, further comprising an opening in a lower portion of the heater unit.

6. The manufacturing apparatus for a semiconductor device according to claim 1, further comprising an exhaust pipe for collecting gas exhausted from the first exhaust unit and gas exhausted from the second exhaust unit.

* * * * *